(12) United States Patent
Yeoh et al.

(10) Patent No.: US 8,217,937 B2
(45) Date of Patent: Jul. 10, 2012

(54) ISOSURFACIAL THREE-DIMENSIONAL IMAGING SYSTEM AND METHOD

(75) Inventors: Terence Sern-Wei Yeoh, Pasadena, CA (US); Neil A. Ives, Hawthorne, CA (US)

(73) Assignee: The Aerospace Corporation, El Segundo, CA (US)

( * ) Notice: Subject to any disclaimer, the term of this patent is extended or adjusted under 35 U.S.C. 154(b) by 991 days.

(21) Appl. No.: 11/729,352

(22) Filed: Mar. 28, 2007

(65) Prior Publication Data

US 2008/0240548 A1 Oct. 2, 2008

(51) Int. Cl.
| | |
|---|---|
| G06T 17/00 | (2006.01) |
| G06T 15/00 | (2006.01) |
| G06T 15/10 | (2006.01) |
| G06K 9/00 | (2006.01) |
| A61B 6/00 | (2006.01) |
| G01N 23/20 | (2006.01) |
| G01N 23/203 | (2006.01) |
| G03B 42/02 | (2006.01) |
| A61B 6/04 | (2006.01) |
| A61B 5/00 | (2006.01) |
| G09G 5/02 | (2006.01) |
| H05G 1/52 | (2006.01) |
| H05G 1/02 | (2006.01) |

(52) U.S. Cl. ........ 345/424; 345/419; 345/427; 345/592; 382/128; 382/130; 382/131; 382/132; 378/4; 378/16; 378/17; 378/70; 378/76; 378/113; 378/179; 378/195; 378/209; 128/922

(58) Field of Classification Search ............... 345/419, 345/424, 427, 592; 382/154, 128–132; 378/113, 378/179, 195, 209, 76; 128/922
See application file for complete search history.

(56) References Cited

U.S. PATENT DOCUMENTS

| | | | | |
|---|---|---|---|---|
| 4,630,202 A | * | 12/1986 | Mori | 378/14 |
| 4,879,668 A | * | 11/1989 | Cline et al. | 345/424 |
| 4,905,148 A | * | 2/1990 | Crawford | 382/131 |
| 5,150,427 A | * | 9/1992 | Frazee et al. | 382/131 |
| 5,371,778 A | * | 12/1994 | Yanof et al. | 378/4 |
| 5,406,479 A | * | 4/1995 | Harman | 378/7 |
| 5,782,762 A | * | 7/1998 | Vining | 600/407 |

(Continued)

FOREIGN PATENT DOCUMENTS

WO WO 9705574 A1 * 2/1997

(Continued)

OTHER PUBLICATIONS

Ketcham, et al., "Acquisition, optimization and interpretation of X-ray computed tomographic imagery: applications to the geosciences", Computers & Geosciences, vol. 27, Issue 4, May 2001, pp. 381-400.*

(Continued)

Primary Examiner — Daniel Hajnik
Assistant Examiner — Roberta D Prendergast
(74) Attorney, Agent, or Firm — K&L Gates LLP

(57) ABSTRACT

An isosurfacial three-dimensional imaging system and method uses scanning electron microscopy for surface imaging of an assumed opaque object providing a series of tilt images for generating a sinogram of the object and a voxel data set for generating a three-dimensional image of the object having exterior surfaces some of which may be obscured so as to provide exterior three-dimensional surface imaging of objects including hidden surfaces normally obscured from stereographic view.

16 Claims, 3 Drawing Sheets

U.S. PATENT DOCUMENTS

| | | | | |
|---|---|---|---|---|
| 5,898,793 | A * | 4/1999 | Karron et al. | 382/131 |
| 5,920,319 | A * | 7/1999 | Vining et al. | 345/420 |
| 6,001,538 | A * | 12/1999 | Chen et al. | 430/316 |
| 6,026,142 | A * | 2/2000 | Gueziec et al. | 378/8 |
| 6,083,162 | A * | 7/2000 | Vining | 600/407 |
| 6,084,980 | A * | 7/2000 | Nguyen et al. | 382/154 |
| 6,091,496 | A * | 7/2000 | Hill | 356/491 |
| 6,141,462 | A * | 10/2000 | Yoshino et al. | 382/284 |
| 6,184,889 | B1 * | 2/2001 | D'Amora | 345/419 |
| 6,320,378 | B1 * | 11/2001 | Maier et al. | 324/307 |
| 6,332,035 | B1 * | 12/2001 | Basu et al. | 382/128 |
| 6,472,745 | B1 * | 10/2002 | Iizuka | 257/723 |
| 6,477,221 | B1 * | 11/2002 | Ning | 378/4 |
| 6,490,476 | B1 * | 12/2002 | Townsend et al. | 600/427 |
| 6,674,430 | B1 * | 1/2004 | Kaufman et al. | 345/419 |
| 6,728,334 | B1 * | 4/2004 | Zhao | 378/62 |
| 6,756,590 | B2 * | 6/2004 | Kazui et al. | 850/9 |
| 6,765,566 | B1 * | 7/2004 | Tsao | 345/419 |
| 6,813,373 | B1 * | 11/2004 | Suri et al. | 382/128 |
| 6,826,297 | B2 * | 11/2004 | Saito et al. | 382/131 |
| 6,853,700 | B1 * | 2/2005 | Numata et al. | 378/4 |
| 6,909,768 | B2 * | 6/2005 | Takagi et al. | 378/4 |
| 6,982,710 | B2 * | 1/2006 | Salomie | 345/420 |
| 7,324,695 | B2 * | 1/2008 | Krishnan et al. | 382/232 |
| 7,340,027 | B2 * | 3/2008 | Timmer | 378/4 |
| 2001/0019177 | A1 * | 9/2001 | Sugihara | 257/780 |
| 2002/0168618 | A1 * | 11/2002 | Anderson et al. | 434/262 |
| 2003/0156746 | A1 * | 8/2003 | Bissell et al. | 382/128 |
| 2003/0161443 | A1 * | 8/2003 | Xiao et al. | 378/210 |
| 2004/0223636 | A1 * | 11/2004 | Edic et al. | 382/131 |
| 2006/0031372 | A1 * | 2/2006 | Krishnan et al. | 709/207 |
| 2006/0072800 | A1 * | 4/2006 | Bernard Deman et al. | 382/131 |
| 2006/0285737 | A1 * | 12/2006 | Hamill et al. | 382/131 |
| 2007/0008317 | A1 * | 1/2007 | Lundstrom | 345/424 |
| 2007/0127791 | A1 * | 6/2007 | Ernvik et al. | 382/128 |
| 2007/0151942 | A1 * | 7/2007 | Dishongh et al. | 216/13 |

FOREIGN PATENT DOCUMENTS

| | | | |
|---|---|---|---|
| WO | WO 2005008586 A2 * | 1/2005 | |

OTHER PUBLICATIONS

Z. Cao, "Simultaneous reconstruction and 3D motion estimation for gated myocardial emission tomography", PhD thesis, University of Florida, Dec. 2003, 110 pages.*

M. Drescher and E. Dormann, "ESR imaging of pyrolytic carbon films", 2004 Europhysics Letters. vol. 67, Issue 5, Sep. 2004, pp. 847-853.*

Erlandsson et al., "3D reconstruction for a multi-ring PET scanner by single-slice rebinning and axial deconvolution", 1994 Physics in Medicine and Biology, Oct. 1993, vol. 39, pp. 619-629.*

Feng et al., "Internal structure of type I deep-sea spherules by X-ray computed microtomography", Meteoritics & Planetary Science, vol. 40, Issue 2, Feb. 2005, pp. 195-206, retrieved online from: http://adsabs.harvard.edu/full/2005M%26PS...40..195F.*

B. Laude et al., "Full-Field Optical Coherence Tomography with Thermal Light", Applied Optics, vol. 41, Issue 31, Nov. 1, 2002, pp. 6637-6645.*

L. Moens, W. Devos, R. Klockenkämper and A. von Bohlen, "Total reflection X-ray fluorescence in the ultramicro analysis of artists' pigments", Trends in Analytical Chemistry, vol. 13, No. 5, May 1994, pp. 198-205.*

A. Rodriguez, D. Ehlenberger, K.T. Kelliher, M. Einstein, S.C. Henderson, P.R. Hof and S.L. Wearne, "Automated reconstruction of 3D neuronal morphology from laser scanning microscopy images", Methods, vol. 30, Issue 1, May 1, 2003, pp. 94-105.*

Thirion, J.-P., "Segmentation of tomographic data without image reconstruction," IEEE Transactions on Medical Imaging, vol. 11, No. 1, pp. 102-110, Mar. 1992.*

Z. L. Wang, "Transmission Electron Microscopy of Shape-Controlled Nanocrystals and Their Assemblies", The Journal of Physical Chemistry B, vol. 104, No. 6, pp. 1153-1175, Jan. 11, 2000.*

Frank Dachille, "Architectures for Realistic Volume Imaging", Preliminary Exam, SUNY at Stoney Brook, 1999, 63 pages.*

Frank Dachille, "Algorithms and Architectures for Realistic Volume Imaging", PhD Thesis, State University of New York at Stoney Brook, May 2002, 239 pages.*

Smit, Jaap; Bosma, Marco K.; van Doesburg, Mark; Lobregt, Steven, "3D and 4D signal processing of volume data", Proceedings 10th ProRISC/IEEE Annual Workshop on Circuits, Systems, and Signal Processing, Nov. 25-26, 1999, Mierlo, The Netherlands, pp. 437-459.*

* cited by examiner (PRIOR ART)
ISOMETRIC OBJECT VIEW (PRIOR ART)
STEREOGRAPHY OBJECT VIEW

ISOSURFACIAL 3D OBJECT VIEW

ISOSURFACIAL IMAGING SYSTEM

ISOSURFACIAL IMAGING PROCESS

ISOSURFACIAL THREE-DIMENSIONAL IMAGING SYSTEM AND METHOD

FIELD OF THE INVENTION

The invention relates to the field of imaging of objects. More particularly the present invention relates to isosurfacial and tomography reconstruction of images.

BACKGROUND OF THE INVENTION

Current isosurfacial reconstruction techniques are limited to two or three image stereograms. Isosurfacial reconstruction methods reconstruct exterior surfaces of objects. A topographical surface map is generated by using edge detection, image correlation, and noise reduction techniques. A limitation of the isosurfacial technique is the lack of information of interior surfaces underneath exterior surfaces and exterior structures. Such interior surfaces are imaged as mesa approximations instead of freestanding films. Topographic reconstruction by stereography may use two or three images spaced apart in angular degree such as five to six degrees. By edge analysis, topographic features are extracted from these few images. However, stereography does not provide an ability to image underneath scrolling regions.

Referring to FIG. 1, a prior art three dimensional object may include a base 10, a support 12, and an extension 14 that overhangs the base 10 defining free space between the base 10 and the extension. The object is a three-dimensional object having an irregular exterior surface defining interior surfaces such as the bottom surface of the extension 14.

Referring to FIG. 2, conventional isosurfacial methods reconstruct the object so as to provide exterior imaging of the object 12. The exterior image includes a base image 16 from the base 10, a support image 18 from the support, and an image extension 20 of the extension 14. The imaging of the extension 14 disadvantageously fails to reveal the free space and a portion of the base 16 under the extension 20. The extension 12 is disadvantageously imaged as a mesa as shown by the image extension.

Current tomography techniques such as X-ray and T-ray techniques, as well as magnetic resonance tomography require transmission micrographs that relay summed absorptive information. This method utilizes sinogram computation to generate a voxel dataset. Transmission electron tomography and focused ion beam nanotomography are both destructive techniques that have been used to image and model nanostructures. However, there are instances in which structural information such as orientation, length and surface morphology must be obtained without damaging the sample. Topographical images generated from stereograms of nanoscrolls, representing current practice, lack details and are distorted. Hidden surfaces are not normally revealed by standard image stereograms. A topographical image of a nanoscroll based on current state of the art stereographic techniques lacks definition and hidden surfaces. The topograph is highly distorted and does not accurately depict necessary structural information.

There are needs for methods to model and image growing nanotechnology that often require strict tolerances, sizes, orientations, and relative positions that greatly affect performance of the nanotechnology. Non-destructive imaging of devices is highly desirable. For example, self-assembled nanoscrolls from strained thin films have generated recent interest due to potential applications in future nanoelectromechanical systems. A focused ion beam can scan nanoscrolls from preprocessed InGaAs/GaAs strained bridges 7-10 µm in length, 1.5 µm in width, and 14 nm thick. Analysis of the scrolling with time showed unexpected scrolling dynamics such as an initial vertical relaxation of the bridge before the initiation of lateral twisting action. This twisting created a curled nanohelix of diameter half of the expected diameter of a nanoscroll. Analysis ruled out the possibility of both incremental strain relief along the bridge as expected from wet etched films and simultaneous strain relief as expected from a released bridge structure. Instead, the strain relief may occur with a combination of both incremental and simultaneous strain relief, which is a result of the topological restrictions of the strained bridge on the curling action of the film. Although some details of the scrolling kinetics are revealed, more detailed analysis could not be performed simply from the two-dimensional images because conventional two-dimensional imaging techniques cannot effectively reveal the internal structure of these complex three-dimensional nanostructures. The nanostructures are too fragile to survive destructive physical analysis using focused ion beam cross-sectioning. Delicate nanometer films often are altered or destroyed during imaging and conventional stereographic imaging is inadequate to show important obscure features of the nanofilms. Conventional stereographic methods can provide topographical information, but the image data is inherently two-dimensional. Imaging noise can often obscure very small features.

Prior isosurfacial and tomography imaging methods and systems do not provide clear imaging of interior surfaces without approximation mesas or the destruction of the objects. Conventional stereographic images are not adequate to fully characterize small objects and nanomaterials. Stereographic optical systems suffer from a lack of hidden surface observation while Transmission Electron and Focused Ion Beam Tomographic techniques suffer from destructive sampling. These and other disadvantages are solved or reduced using the invention.

SUMMARY OF THE INVENTION

An object of the invention is to provide surface imaging of objects.

Another object of the invention is to provide nondestructive surface imaging of objects.

Yet another object of the invention is to provide isosurfacial three-dimensional imaging of an object.

Still another object of the invention is to provide isosurfacial three-dimensional imaging of an object using a series of tilt images that are processed by tomographic computations in an isosurfacial imaging process.

The invention is directed to a three-dimensional isosurfacial imaging system and method for imaging objects that may have obscure interior surfaces hidden from exterior views. The system captures a series of tilt images that are used to reconstruct an isosurface of the object that is a three-dimensional model image. The system then processes the series of tilt images using enhanced tomographic computations. The system can apply a special case in computer-aided tomography that assumes complete transmission or complete absorption in order to compute the density micrograph.

The system and method uses a transmissive approximation. The transmission density micrograph series used for sinogram computation in tomography assumes by the transmissive approximation that the imaged structure contains members that are either completely opaque or transmissive. This transmissive approximation is often the case for traditional imaging techniques such as optical or scanning electron microscopy. By inverting the image series of tilt images, a pseudo-transmission density micrograph is generated. This pseudo-transmission density micrograph can be then used to generate a sinogram from which is calculated a voxel dataset. Due to this transmissive approximation, the voxel dataset only contains the topographical information of the structure. The topographical information provided enhanced stereographic imaging and provides more accurate and more detail isosurfacial three-dimensional image of the object under imaging.

Isosurfacial three-dimensional imaging preferably uses scanning electron microscopy as a surface imaging technique and assumes the object is opaque so that no absorptive information is acquired and assumes that non-imaged portions of the object is free space and hence transmissive. As such, internal information will not be gathered or projected, but exterior surfaces including obscured surfaces will be imaged. The system and method can be applied to nanometer-scale structures having obscure interior surfaces. This method can be applied to scanning electron micrography and to conventional optical techniques. The method can improve signal to noise ratio over conventional stereogram topography techniques due to the number of sample points. In addition, surface information that is partially hidden by other features can be imaged. These and other advantages will become more apparent from the following detailed description of the preferred embodiment.

DETAILED DESCRIPTION OF THE PREFERRED EMBODIMENT

Figure 1:
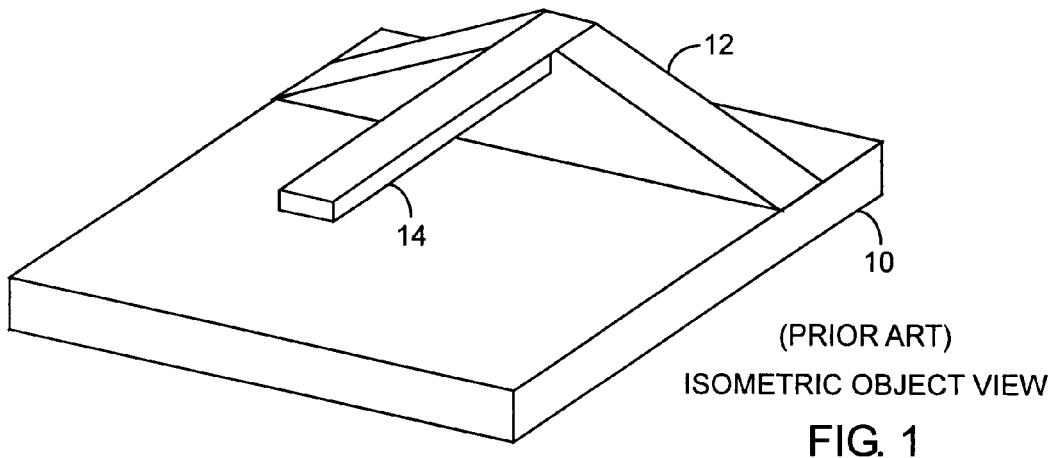
FIG. 1 is a prior art isometric view of an object.
Figure 2:
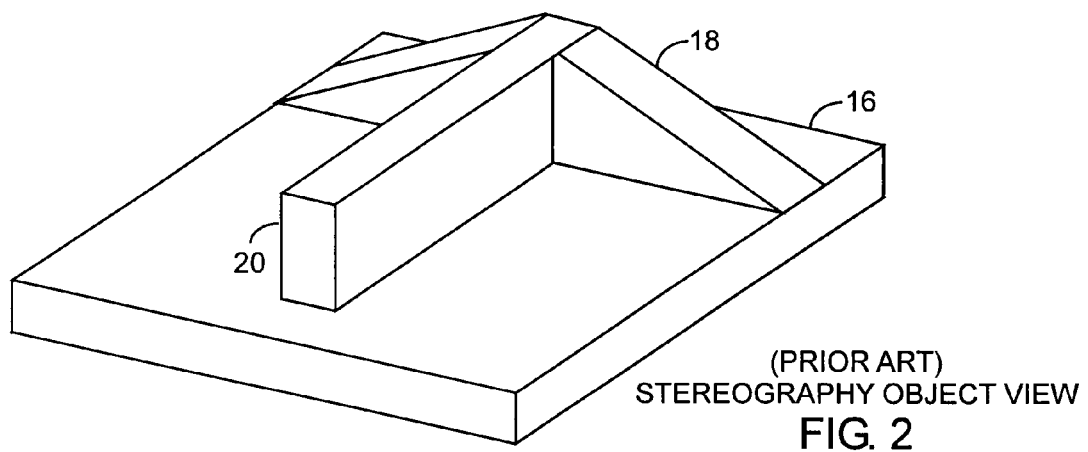
FIG. 2 is a prior art stenographic view of the object.
Figure 3:
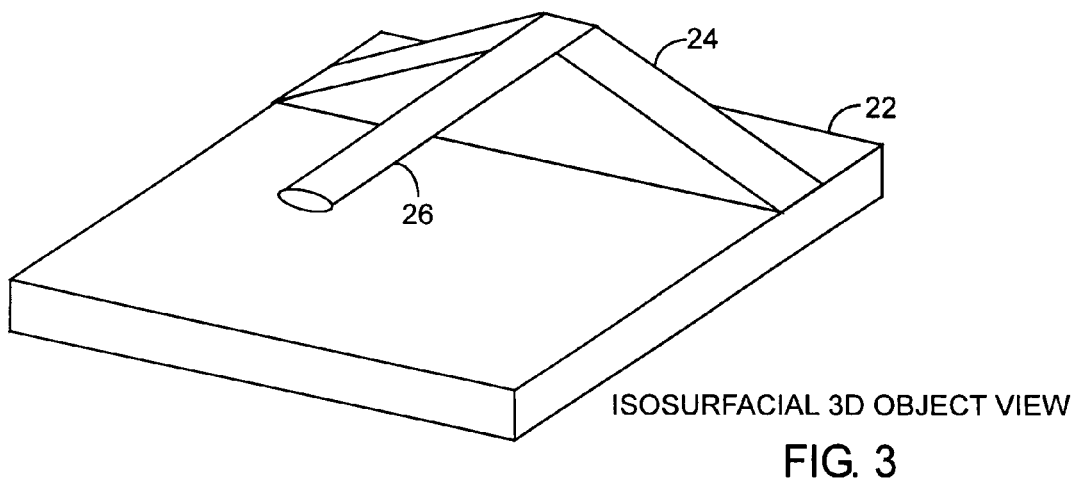
FIG. 3 is an isosurfacial view of the object.
Figure 4:
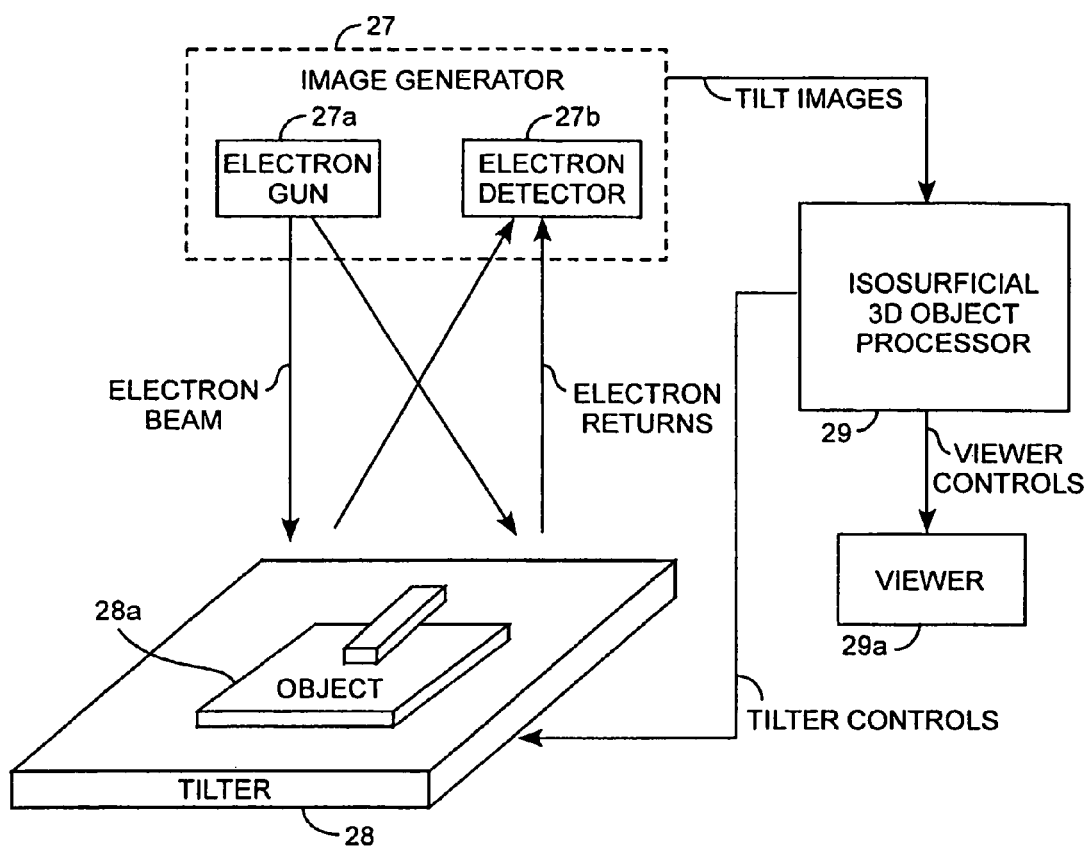
FIG. 4 is a block diagram of an isosurfacial imaging system.

An embodiment of the invention is described with reference to the figures using reference designations as shown in the figures. Referring to FIG. 1 through 4, and particularly to FIGS. 3 and 4, an isosurfacial imaging system is used to image an object for providing an isosurfacial three-dimensional image. An exemplar object having a base 10, support 12, and extension 14 is imaged into an isosurfacial three-dimensional image of object. The isosurfacial three-dimensional image of the object includes an isosurfacial image base 22, an isosurfacial imaged support 24, and an isosurfacial imaged extension 26. As is apparent, the imaged extension 26 reveals free space under the imaged extension 26. The depicted object 10, 12, and 14 is simple in features to clearly show the imaging of the object for providing images of obscure hidden surfaces. However, more complex and micro sized object could be imaged as well. For example, the object could be a nanohelix object having nano sized exterior surfaces obscured from conventional stereography.

The isosurfacial imaging system includes image generator 27 having an electron gun 27a and an electron detector 27b for respectively generating an electron beam and detecting electron returns as is common in scanning electron microscopy. The image generator captures images of the object on a tilter 28 that can be tilted to various angular positions relative to the electron beam direction. The tilter 28 would have mechanical motors, not shown, preferably controlled by a processor, such as an isosurfacial three-dimensional object processor 29 providing tilter control signals to the tilter 28. The imaging system captures non-destructive images of the object 28a at various angles. The non-destructive imaging can be effective at the nanoscale. The scanning electron beam series of captured tilt images may span, for example, 120 degrees in order to reconstruct as sufficiently desired isosurfacial three-dimensional images of object 28a that may be a self-assembled freestanding semiconductor nanowire and nanohelix. The image generator provides the series of tilt images to the processor 29. The processor 29 processes the tilt images for generating the isosurfacial three-dimensional image that are displayed on a viewer 29a showing an isometric object view that reveals hidden exterior surfaces that are normally obscured from stenographic view.

Figure 5:
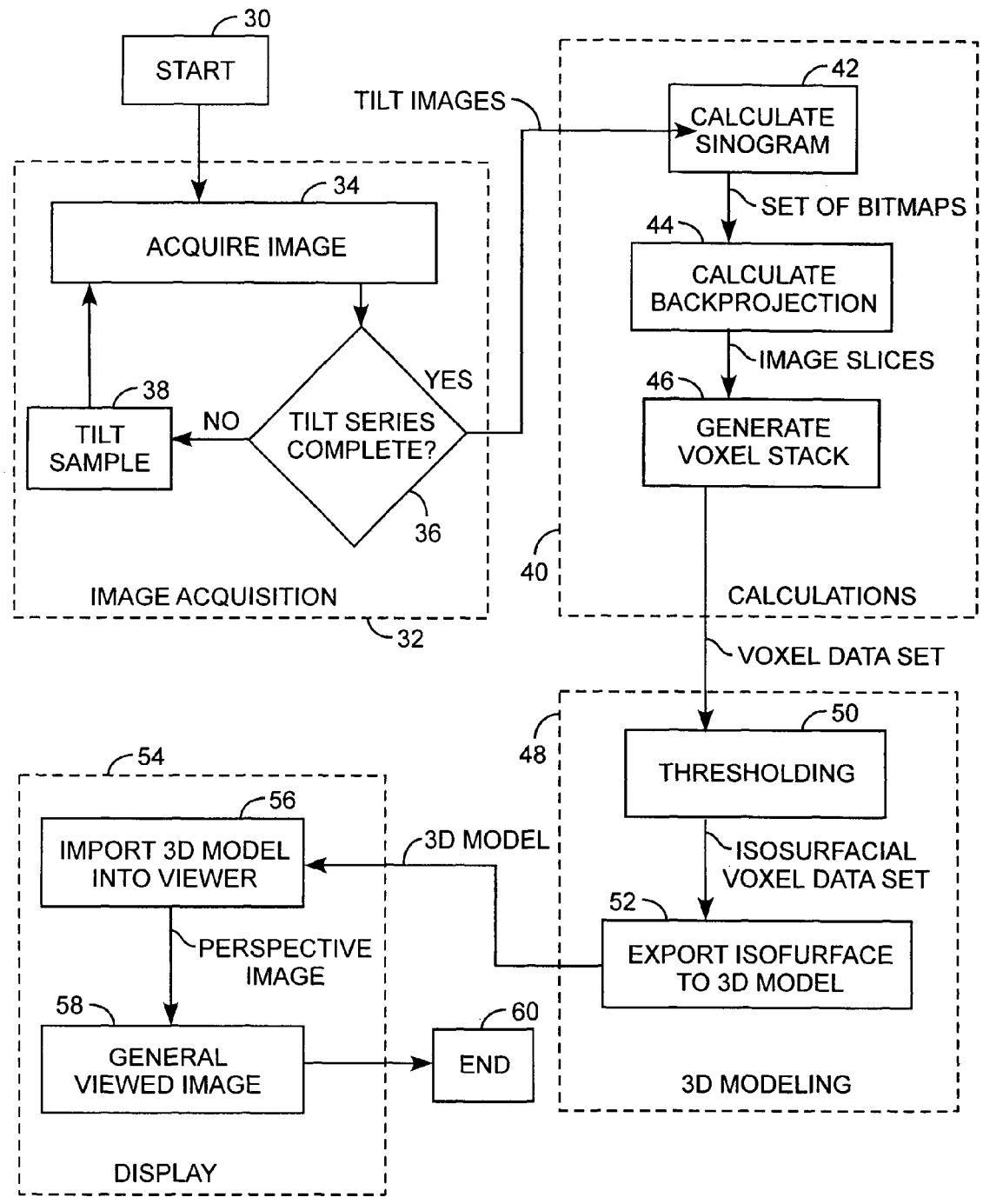
FIG. 5 is a process flow diagram of an isosurfacial imaging process.

Referring to all of the figures, and more particularly to FIG. 5, the isosurfacial imaging process is used to create a three-dimensional view of the object 28a. General process flow for isosurfacial tomographic reconstruction uses modified imaging processes.

In step 30, the process starts with a preliminary set up such as placing the object 28a on the tilter 28 and aligning the image generator 27 to the tilter 28. Imaging parameters necessary to begin the process are included such as the number of images, degrees of angular tilt, and the spacing between each tilt angle, all of which are used to define the captured tilt images.

In step 32, a series of tilt images are acquired during image acquisition. The image acquisition process receives the imaging parameters and captures the tilt images in steps 38, 36, and 38. Tilt image acquisition 32 provides a series of bitmaps tilt images at various tilt angles, determines when all the tilt images at respective tilt angles have been acquired and captured, and tilts the object 28a in angular steps during acquisition until all the specified tilt angles been used. The output of the image acquisition process is the series of tilt images of bitmaps at specified tilts angles. The bitmaps are in an X-Y intensity data structure. The tilt images are aligned with respect to each other during acquisition.

In substep 34, each of the tilt images is acquired after each angular tilt. The acquired tilt images are the detected signal from the electron detector 27b. The object 28a of interest is imaged at high contrast with n tilts at fixed degree increments. The detector 27b collects the electron returns as detected signals and forms the detected signals into an array of detected signal levels. Each tilt image is a bitmap of the intensity of the detected signal.

In substep 36, the image acquisition process determines when the tilting at all of the specified tilt angles is complete. The image parameters provide the total degrees of tilt and tilt spacings. When the total degrees of tilt have not been met, then the tilt controls commands the tilter 28 tilt more for a specified angular incremental amount. When the total degrees of tilt have been reached, then the captured tilt images are communicated to the processor 29 for processing the tilt images.

In substep 38, the object 28a is tilted by the specified tilt angular incremental amount. The tilt controls provide a command to the tilter 28 to tilt the sample by the specified angular incremental amount so that the image generator can acquire another one of the tilt images. Scanning electron microscopy micrograph tilt images may be, for example, the 120 tilt images of a nanoscroll self-assembled object 28a. The intensities of the bitmaps are inverted to generate the tilt images as pseudo transmissive micrographs.

In step 40, calculations upon the tilt images are made to generate a voxel data set. The calculating process operates upon the series of bitmap tilt images at various tilt angles. The calculations provide the voxel data set representing a three-dimensional image of the object 28a in an 3-d array of signal intensity levels with X, Y, and Z spatial three-dimensional coordinates. This calculation provides the voxel data set for further 3-D modeling. An improvement of the calculation step may include presegmenting the tilt images before sinogram computation. As the tilt images are in two-dimensional intensity format indexed to the tilt angle. Conventional segmentation processes can be used to isolate various segments of the object 28a. Segmentation translates the tilt images into sets of tilt images. Each set of tilt images defines only a segment of the object 28a. The tilt images of the entire object 28a or a set of tilt images for a segment can be further processed in the same manner.

In substep 42, the sinogram calculation is made from the bitmapped tilt images and from the imaging parameters. When segmenting, sinogram calculation is executed upon each set of tilt images. The sinogram calculation computes a Radon transform of the tilt images. The Radon transform uses an integral function. The integral function is taken over the set of all row lines in all the bitmaps at each tilt angle to generate the Radon transform for providing a set of bitmaps in the transform domain representing a cross-sectional slice of the object 28a or segment.

In substep 44, a backprojection calculation is executed upon the set of bitmaps from the sinogram calculation for generating respective image slices. The backprojection calculation computes the filtered backprojection function as an inversion of sinogram, that is, the set of bitmaps in the Radon transform domain. Each row is defined by the Radon transform. The inversion of each row operates to project a plane back over the row to produce an image in bitmap structure. The image in bitmap structure defines a slice. The backprojection calculation provides a set of image slices representing cross-sectional slices of the object 28a or object segment.

In substep 46, the image slices are used to generate a voxel stack as a voxel data set. The voxel stack generation collates the cross-sectional slices, that is, the set of image slices, and generates a three-dimensional volumetric array where each pixel has an X, Y, and Z spatial coordinate. The output voxel stack generator is a three-dimensional array of images having edge pixels represent a real surface of the object 28a or object segment.

In step 48, 3D modeling is used to translate the voxel data set into a 3D model. The 3D model contains vertices, edges between the vertices, and faces when the edges form a triangle or square when the edges connect. The 3D model is a list of vertices, edges of interconnected vertices, and faces in order to describe the shape of the object 28a or object segment. This 3D model data set of interconnected vertices is used to display the object 28a or object segment. The voxel data set is exported to the 3D modeling process that can be implemented using a conventional rendering software package.

In substep 50, thresholding is applied to the voxel data set. The voxel data set is a volumetric array of intensities with X, Y, and Z spatial coordinates generated by the voxel stack generation. Thresholding uses a threshold value. The threshold value can be predetermined, varies by operator controls, or by an algorithm operating upon the varying intensities of the voxel stack. The intensity values below the threshold are set to zero for implementing the transmissive assumption, and intensity values above the threshold are set to one for implementing the opaque assumption. As such, the object 28a is rendered in either free spaces or solid surfaces. As such, the volumetric array is filled with ones or zeroes, that is of transmissive or opaque surface pixels that define the object 28a or object segment. The thresholding serves to null interior volumes and transmissive free space pixels about and in the object 28a or object segment. The thresholding of the voxel data set provides a quantized voxel data set. The thresholding uses conventional isosurfacial generation algorithms to translate the quantized voxel data set into an isosurfacial voxel data set. The translation of the quantized voxel data set into the isosurfacial voxel data set is accomplished by taking the first derivative of the array intensities with respect to X, Y, and Z spatial coordinates of the quantized voxel data set.

In substep 52, the isosurfacial voxel data is translated into the 3D model using conventional 3D modeling algorithms and exports the 3D model for operator viewing. The 3D modeling approximates the outer surface of the object 28a or object segment by finding the edges at which the array changes from zero to one. The 3D modeling models the edges as spatial points and interconnects these spatial points. The 3D modeling then provides a 3D model dataset of interconnected vertices that describe the surface shape of the object 28a or object segment. This 3D model dataset of interconnected vertices is output for viewing.

In step 54, a display process receives the 3D model and displays a rendering of the object 28a. The 3D model dataset of interconnected vertices describe the surface shape of the object generated by 3D modeling. The display process converts the 3D model dataset into a visual 3D model for display and calculates an image of the 3D model that can then be displayed.

In substep 56, the 3D model is imported and converted. The import process converts the interconnected vertices of the 3D model dataset into 3D faces and projects the 3D faces into a perspective image of the object 28a. The conversion uses angular perspective and lighting to generate a real perspective image of the object 28a or object segment for display.

In substep 58, the general viewed image of the object 28a is realized. The real perspective image is presented as a general viewed image of the object 28a. The real perspective image is displayed by the viewer 29a that may be a video monitor. The 3D rendering of the object 28a is by converting the 3D model into a viewing data format viewable by an operator. The output of this general viewer image process is a viewable rendering of the object 28a showing surfaces of the object 28a or object segment.

In step 60, the isosurfacial imaging process ends. The 3D model data set can be stored or later used and transmitted to remote sites for additional viewing. Once the object 28a is rendered in the viewing data format, the object image can be rotated and examined from various directions by the operator. In this direction, the individual scrolling elements can be observed. Accurate lengths and thicknesses can be derived using this nondestructive technique.

The process approximates the transmission density micrograph series needed for sinogram computation in tomography by assuming the imaged structure contains members that are either completely opaque or transmissive. This is often the case for traditional imaging techniques such as optical or scanning electron microscopy. By inverting this image tilt series, a pseudo-transmission density micrograph is generated. Isosurfaces of an object can be clearly generated from the tomographic computations using this transmissivity assumption and quantization. The resulting 3D model provide information on the orientation and thickness as well as to reveal important features from within the structure or object such as the number of curls and the orientation of the curls of a nanostructure. The isosurfacial tomographic reconstruction and rendering provides details of surfaces underneath freestanding structures. The tomographic computation of isosurfaces using the scanning electron microscope provides a nondestructive method for accurately determining physical attributes on the micron to nanometer scales without having to destroy or modify the sample of interest. This was accomplished by applying a special case in computer-aided tomography that assumes complete transmission or complete absorption.

By utilizing this transmissivity special case, isosurfaces can be generated from the tomographic computations. The isosurfacial imaging system and methods preserves hidden underlying surface information while generating true three-dimensional images. This nondestructive method is directly applicable to many areas of study. In addition to applications in nanoelectromechanical systems, nanohelices also have potential photonic and nanoelectronic applications. The three dimensional imaging method will be useful for future investigations of nanoscale devices of interest to national security space programs. The system and method are directly applicable in the field of metrology for both optical and electron microscopy. By adding a precision stage to a microscope, topographical information of complex structures can be formed, increasing the understanding of the object structure. The method can be implemented into an automated system capable of generating three-dimensional models of objects based on the series of tilt images. The system and method can be applied to small nanostructures such as curling nanoscrolls made from a relaxed strained thin film for creating many exterior surfaces hidden from stereographic view.

The method can be improved by manually segmenting the features of interest before applying the sinogram computation. This segmenting improvement utilizes segmentation by serial sectioning the series of tilt images. The segmentation removes unwanted noise and improves the sonogram signal and final isosurface. That is, the method can be improved by first segmenting the image structure components before computing the sinogram. This added preprocessing step greatly reduces the noise and improves the signal during sinogram computation. The resulting voxel dataset can be linearly combined with the other segmented objects to reconstruct the entire structure with improved detail. Those skilled in the art can make enhancements, improvements, and modifications to the invention, and these enhancements, improvements, and modifications may nonetheless fall within the spirit and scope of the following claims.

What is claimed is:

1. A system for generating a voxel data set representing an image of an object, the system comprising,
a tilter upon which is disposed the object for changing angular positions of the object,
an image generator configured to:
illuminate the object
detect reflected returns from the object, and
generate tilt images of the object for the respective angular positions based on the reflected returns, and
a processor programmed
for generating transmissive approximations of the tilt images, wherein each transmissive approximation represents an assumed transmission density of a corresponding tilt image selected from the tilt images, wherein generating each transmissive approximation comprises inverting intensities of pixels making up the corresponding tilt image,
for translating the transmissive approximations of the tilt images into respective sinograms,
for translating the sinograms into image slices, and
for generating the voxel data set.

2. The system of claim 1 wherein,
the illumination of the object is an electron beam illumination,
the returns are electron returns, and
the image generator comprises an electron gun for generating the electron beam and an electron detector for detecting the electron returns.

3. The system of claim 1 wherein,
the object comprises exterior surfaces and comprises hidden surface, and
the hidden surfaces being hidden from illumination at one angle of the angular positions and exposed to the illumination at another angle of the angular positions.

4. The system of claim 1 wherein,
the processor translates the voxel data set into an isosurfacial voxel data set, and
the isosurfacial voxel data set has quantized points indicating transmissive or opaque points in three dimensional space.

5. The system of claim 1 wherein,
the processor translates the voxel data set into an isosurfacial voxel data set,
the isosurfacial voxel data has quantized points indicating transmissive or opaque points in three dimensional space, and
the processor translates the isosurfacial voxel data set into a 3D model.

6. The system of claim 1 wherein,
the processor translates the voxel data set into an isosurfacial voxel data set,
the isosurfacial voxel data has having quantized points indicating transmissive or opaque points in three dimensional space, and
the processor translates the isosurfacial voxel data set into a 3D model, and
the processor translates the 3D model into a perspective three-dimensional view of the object.

7. The system of claim 1 wherein,
the object comprises exterior surfaces and comprises hidden surfaces,
the hidden surfaces being hidden from illumination at one angle of the angular positions and exposed to the illumination at another angle of the angular positions,
the processor translates the voxel data set into an isosurfacial voxel data set,
the isosurfacial voxel data set has quantized points indicating transmissive or opaque points in three dimensional space,
the processor translates the isosurfacial voxel data set into a 3D model,
the process translates the 3D model into a perspective three-dimensional view of the object, and
the perspective three-dimensional view of the object reveals the hidden surfaces.

8. A system for generating a voxel data set representing an image of an object, the object comprises exterior surfaces and comprises hidden surfaces, the hidden surfaces being hidden during a first perspective view of the object at a first angle and revealed during a second perspective view of the object at a second angle, the system comprising,
a tilter upon which is disposed the object for changing angular positions of the object,
an image generator configured to:
illuminate the object
detect reflected returns from the object,
generate tilt images of the object for the respective angular positions based on the reflected returns, the hidden surfaces being hidden from the illumination at the first angle of the angular positions and exposed to the illumination at the second angle of the angular positions, a processor programmed
for generating transmissive approximations of the tilt images, wherein each transmissive approximation represents an assumed transmission density of a corresponding tilt image selected from the tilt images, wherein generating each transmissive approximation comprises inverting intensities of pixels making up the corresponding tilt image,
for translating the transmissive approximations of the tilt images into respective sinograms,
for translating the sinograms into image slices, and
for generating the voxel data set,
for translating the voxel data set into an isosurfacial voxel data set, the isosurfacial voxel data set having quantized points indicating transmissive or opaque points in three dimensional space,
for translating the isosurfacial voxel data set into a 3D model, the process translating the 3D model into a perspective three-dimensional view of the object, the perspective three-dimensional view of the object revealing the hidden surfaces, and a display for displaying the perspective three-dimensional view of the object for displaying the hidden surfaces.

9. The system of claim 8 wherein,
the illumination of the object is an electron beam illumination,
the returns are electron returns, and
the image generator comprises an electron gun for generating the electron beam and an electron detector for detecting the electron returns.

10. A method for generating an isosurfacial voxel data set of an object oriented at angular positions, the method comprising the steps of
illuminating the object with illuminations at the angular positions,
sensing reflected illumination returns of the object at the angular positions for generating respective tilt images of the object,
generating transmissive approximations of the tilt images, wherein each transmissive approximation represents an assumed transmission density of a corresponding tilt image selected from the respective tilt images, wherein generating each transmissive approximation comprises inverting intensities of pixels making up the corresponding tilt image,
calculating sinograms from the transmissive approximations of the tilt images for generating a set of bitmaps,
calculating backprojections of the set of bitmaps for generating image slices of the object,
generating a voxel stack from the image slices, and
thresholding the voxel data set for quantizing the voxel data set for providing the isosurface voxel data set.

11. The method of claim 10 further comprising the steps of,
translating the isosurfacial voxel data set into a 3D model,
translating the 3D model into a perspective three-dimensional image, and
displaying the perspective three-dimensional image.

12. The method of claim 10 wherein,
the object comprises exterior surfaces and comprises hidden surfaces,
the hidden surfaces being hidden from illumination at one angle of the angular positions and exposed to the illumination at another angle of the angular positions, and further comprising the steps of
translating the isosurfacial voxel data set into a 3D model,
translating the 3D model into a perspective three-dimensional image, and
displaying the perspective three-dimensional image to reveal the hidden surfaces.

13. The method of claim 10 wherein,
the illuminations of the object are electron beam illuminations, and
the illumination returns are electron returns.

14. The method of claim 10 further comprising the step of,
segmenting the tilt images into a set of tilt images, each of the tilt images representing respective object segments, and
each of the illuminating, sensing, first calculating, second calculating, and generating steps are executed for each of the object segments.

15. The method of claim 10 wherein the thresholding step comprising the steps of,
quantizing the voxel data set into a quantized voxel data set, and
translating the quantized voxel data set into an isosurfacial voxel data set.

16. The method of claim 10 wherein the thresholding step comprising the steps of,
quantizing the voxel data set into a quantized voxel data set, the quantizing by thresholding of intensity values of the voxel data set for digitizing the intensity values to discrete values, the discrete values indicating transmissivity or absorption of volumetric points within the voxel data set, and
translating the quantized voxel data set into an isosurfacial voxel data set.

* * * * *